US009214621B2

(12) United States Patent
Gerletz et al.

(10) Patent No.: US 9,214,621 B2
(45) Date of Patent: Dec. 15, 2015

(54) PIEZOELECTRIC MULTILAYER COMPONENT AND METHOD FOR FORMING AN EXTERNAL ELECTRODE IN A PIEZOELECTRIC MULTILAYER COMPONENT

(75) Inventors: Peter Gerletz, Graz (AT); Georg Kuegerl, Eibiswald (AT); Michael Stahl, Poelfing Brunn (AT); Andreas Stani, Leibnitz (AT)

(73) Assignee: EPCOS AG, Munich (DE)

( * ) Notice: Subject to any disclaimer, the term of this patent is extended or adjusted under 35 U.S.C. 154(b) by 412 days.

(21) Appl. No.: 13/702,526

(22) PCT Filed: Jun. 6, 2011

(86) PCT No.: PCT/EP2011/059271

§ 371 (c)(1), (2), (4) Date: Feb. 19, 2013

(87) PCT Pub. No.: WO2011/154348

PCT Pub. Date: Dec. 15, 2011

(65) Prior Publication Data

US 2013/0140960 A1 Jun. 6, 2013

(30) Foreign Application Priority Data

Jun. 7, 2010 (DE) ........................ 10 2010 022 925

(51) Int. Cl.

*H01L 41/08* (2006.01)
*H01L 41/047* (2006.01)
*H01L 41/293* (2013.01)

(52) U.S. Cl.

CPC .......... *H01L 41/0472* (2013.01); *H01L 41/293* (2013.01); *Y10T 29/42* (2015.01)

(58) Field of Classification Search

CPC ................................................ H01L 41/0472
USPC ........................................ 310/328, 365, 366
See application file for complete search history.

(56) References Cited

U.S. PATENT DOCUMENTS

| | | | | |
|---|---|---|---|---|
| 4,803,763 A * | 2/1989 | Eturo et al. | ................ | 29/25.35 |
| 5,438,232 A * | 8/1995 | Inoue et al. | .................. | 310/328 |
| 6,307,306 B1 | 10/2001 | Bast et al. | | |
| 6,411,018 B1 | 6/2002 | Heinz | | |
| 7,276,837 B2 | 10/2007 | Boecking | | |
| 7,429,817 B2 | 9/2008 | Asano et al. | | |
| 7,851,979 B2 * | 12/2010 | Kronberger | .................. | 310/366 |
| 2002/0135275 A1 | 9/2002 | Heinz et al. | | |
| 2006/0091766 A1 * | 5/2006 | Mochizuki et al. | ........... | 310/366 |
| 2006/0232170 A1 * | 10/2006 | Takaoka et al. | ............... | 310/363 |
| 2006/0232288 A1 | 10/2006 | Okane et al. | | |
| 2007/0247025 A1 | 10/2007 | Sciortino et al. | | |
| 2008/0001503 A1 | 1/2008 | Asano et al. | | |
| 2013/0074300 A1 * | 3/2013 | Malek et al. | ................ | 29/25.35 |

(Continued)

FOREIGN PATENT DOCUMENTS

| | | |
|---|---|---|
| DE | 41 09 055 A1 | 10/1991 |
| DE | 199 28 189 A1 | 4/2001 |

(Continued)

*Primary Examiner* — J. San Martin
(74) *Attorney, Agent, or Firm* — Slater & Matsil, L.L.P.

(57) ABSTRACT

A piezoelectric multilayer component is specified. At least one external electrode is fixed to a stack of piezoelectric layers and electrode layers arranged therebetween. At least one region of the external electrode projects beyond the stack and the external electrode is at least partly pressure-deformed in said region. Furthermore, a method for forming an external electrode in a piezoelectric multilayer component is specified.

14 Claims, 2 Drawing Sheets

1 9a 9b 8 14 7 4 2 20 3 6 15

(56) References Cited

U.S. PATENT DOCUMENTS

2013/0328448 A1 * 12/2013 Gabl et al. .................... 310/340
2015/0054388 A1 * 2/2015 Itagaki et al. ................. 310/364

FOREIGN PATENT DOCUMENTS

DE 100 26 005 A1 12/2001
DE 10 2004 015 574 A1 11/2004
DE 10 2005 035 158 A1 3/2006
DE 10 2006 006 077 A1 8/2007
DE 10 2007 000 357 A1 1/2008
DE 10 2008 003 840 A1 7/2009
DE 102008003840 * 7/2009
EP 1 579 515 B1 9/2005
JP 2010020643 A 1/2010
JP 2010105729 A 5/2010

* cited by examiner 1
9a
9b
8
14
4
2
7
20
3
6
15

1
19
18
6a
11
2a
5a
10
14
3
5b
2b
10
11
20
6b 16
2
7
3
14
6
15
20
8
12
17

PIEZOELECTRIC MULTILAYER COMPONENT AND METHOD FOR FORMING AN EXTERNAL ELECTRODE IN A PIEZOELECTRIC MULTILAYER COMPONENT

This patent application is a national phase filing under section 371 of PCT/EP2011/059271, filed Jun. 6, 2011, which claims the priority of German patent application 10 2010 022 925.3, filed Jun. 7, 2010, each of which is incorporated herein by reference in its entirety.

TECHNICAL FIELD

The present invention relates generally to components and, in particular embodiments, to a piezoelectric multilayer component and method for forming an external electrode in a piezoelectric multilayer component.

BACKGROUND

A piezoelectric multilayer component comprising an external electrode fixed to the stack is described in the document WO 0191199 A1.

SUMMARY OF THE INVENTION

A piezoelectric multilayer component comprising a stack of piezoelectric layers and electrode layers arranged therebetween is specified. In order to make electrical contact with the electrode layers, external electrodes can be fixed to the outer side of the stack. Multilayer components of this type can be embodied as piezoactuators, for example, and are used for example for actuating an injection valve in a motor vehicle.

In one aspect, an external electrode allows electrical contact to be made as simply and cost-effectively as possible.

A piezoelectric multilayer component comprising a stack of piezoelectric layers and electrode layers arranged therebetween is specified. The multilayer component comprises at least one external electrode.

Preferably, the component comprises at least one second external electrode. The external electrodes can be arranged for example on different side areas of the component. The electrode layers can, for example, as seen in the stacking direction, alternately be led as far as to one of the external electrodes and be electrically connected thereto and be set back into the stack relative to the second external electrode. In this way, electrical contact can be made with the electrode layers by means of one of the external electrodes alternately along the stacking direction.

The external electrode has a first and a second region, wherein the first region is fixed to the stack and the second region, for example in the direction of the stacking direction, projects beyond the stack. In this case, the second region constitutes an extension of the first region. Preferably, the first and second regions are embodied integrally, wherein for example the first region and the second region comprise the same material.

A base metallization can be applied on a side area of the stack, said base metallization comprising for example materials such as silver-palladium or copper and making contact with the electrode layers situated in the stack.

The first region of the external electrode is fixed to the stack, preferably to the base metallization, for example by means of a solder material or a conductive adhesive.

Furthermore, the external electrode is at least partly pressure-deformed in the second region. A pressure deformation of the second region of the external electrode can be produced for example by crimping, but possibly also by some other plastic forming process. By way of example, a dimensionally stable deformation of the external electrode can be achieved in this case. The pressure-deforming can be carried out on an external electrode already fixed to the stack. This makes possible a particularly simple embodiment of an external electrode. As an alternative thereto, the step of pressure-deforming can also be carried out before the external electrode is fixed to the stack.

A further contact-connection, for example, can be fitted to the second region of the external electrode. The further contact-connection can be effected for example by soldering or welding a connection element, for example a connection wire, to the second region of the external electrode. Since the second region of the external electrode projects beyond the stack of piezoelectric layers and electrode layers arranged therebetween, it is thus possible to avoid additional soldering and welding processes at the surface of the stack of piezoelectric layers and electrode layers which can lead to damage to the layers.

The second region of the external electrode projecting beyond the stack can be adapted by the pressure-deforming to the specific geometrical and mechanical requirements of the further contact-connection. For this purpose, during the process of pressure-deforming by way of example, the contact pressure and the engagement region of a pressing tool can be chosen suitably. By way of example, the width and the thickness of the external electrode can be adapted to the installation space by means of a single process step. External contact-making that is as slender and close-fitting as possible and takes up as little space as possible is often advantageous on account of structural space restrictions, for example.

The first and second regions of the external electrode are preferably formed from a common, conductive element. The latter can be integral, for example. The conductive element is preferably shaped in a planar fashion. By way of example, the element has the same outer form in the first and second regions in its initial form and is pressure-deformed in the second region in a later method step. The fact that the external electrode is formed from a common element in the first and second regions simplifies the process for producing the external electrode, for example, since the second region projecting beyond the stack need not first be connected to the first region by welding or soldering processes.

By way of example, the external electrode is embodied such that it is at least partly flat. Preferably, the external electrode is embodied such that it is flat in the entire first region. In the region embodied in a flat fashion, the thickness of the external electrode is preferably significantly less than the width of the external electrode. In its region embodied in a flat fashion, the external electrode preferably extends substantially within a two-dimensional area, which hereinafter is called the main area of the external electrode. Preferably, the external electrode extends within the main area in the first region.

In one embodiment, the external electrode is arranged with the main area at the stack in the first region. Preferably, the external electrode bears with the main area on the stack in the first region. The first region of the external electrode can be fixed to the stack over the whole area for example by means of a solder material, i.e., all partial regions of the external electrode in the first region are directly fixed to the stack, for example to a base metallization of the stack.

In one embodiment, the external electrode extends over a large part of a side area of the stack in the first region. The width of the external electrode in the first region can correspond for example virtually to the width of the side area. Preferably, the external electrode in the first region is at least half as wide as the side area of the stack.

In a further embodiment, in the second region of the external electrode, at least one partial area of the external electrode is inclined relative to the main area. This inclination preferably arises by virtue of the fact that the external electrode firstly bears with the main area at the stack in the first region and secondly is deformed by a pressing tool in the second region.

By way of example, in the second region of the external electrode, two or more partial areas of the external electrode bear against one another. As a result of the pres sure-deformation in the second region of the external electrode, which is embodied such that it is flat, for example, in its initial state, such that the partial areas in the initial state lie within a plane, for example, the external electrode can be deformed in the second region such that two or more partial areas are in contact with one another after the pressure-deformation in the second region. In particular, the two or more partial areas of the external electrode bearing against one another can bear against one another in such a way that two electrically conductive regions of the partial areas bearing against one another are in direct electrical contact with one another.

Preferably, the partial areas bearing against one another are free of an insulating coating. What can advantageously be achieved as a result is that a reliable electrical contact is provided which, in particular, can be ensured even in the case of damage to a partial region, for example on account of the external electrode being torn in this region.

Furthermore, the external electrode can be at least partly folded in the second region. The external electrode is bent by the pressure-deforming for example in the center of the second region, wherein two partial areas are pressed onto one another, such that a stable connection of the partial areas arises. The pressure-deformation of the external electrode in the second region, for example by means of a crimping tool, can thus give rise to an at least partial folding of the external electrode in the second region.

In one embodiment, the external electrode is embodied as a net. The net can comprise wires that are interwoven. The wires can comprise materials such as, for example, steel, copper or an iron-nickel alloy. Alternatively, the wires can also comprise other materials.

The net can be fixed for example at least at points to the base metallization which is applied on a side area of the stack and makes contact with the electrode layers situated in the stack. An extendable region can be formed between the point contacts. It is thereby possible to prevent cracking in the external electrodes which can arise as a result of mechanical stresses within the piezoelectric layers.

In one embodiment, at least one wire leads from the first region into the second region. The wire has a first and second section, for example, wherein the first section bears on the stack and the second section projects beyond the stack.

In one embodiment, in the second region, at least one wire has at least two wire sections, wherein the wire has a different thickness in the first wire section than in the second wire section. By way of example, as a result of the at least partial pressure-deformation of the external electrode in the second region, one or a plurality of wire sections of one wire or of more wires can be deformed such that the thickness of individual wire sections is different after the pressure-deformation. The thickness of the pressure-deformed wire can be set to a desired value through a suitable choice of the pressing pressure.

Alternatively, the external electrode can also be embodied as sheet metal. By way of example, the sheet metal is provided with holes and has an increased extensibility as a result. By way of example, cracking of the external electrode can be prevented as a result.

In one embodiment, in the second region, the external electrode has at least one partial region in which the width of the external electrode is less than the width of the external electrode in the first region. In this case, the term "width" preferably denotes the extent of the external electrode in a direction transversely with respect to the stacking direction, wherein the direction is parallel to a side area of the stack on which the first region of the external electrode is arranged.

The smaller width of the external electrode in the second region in comparison with the first region can preferably be obtained by a pressure-deformation of the external electrode in the second region, for example by crimping. By way of example, a slender form of the second region of the external electrode projecting beyond the stack can be achieved as a result, which is advantageous in the case of structural space restrictions.

In a further embodiment, in the second region, the external electrode has at least one partial region in which the thickness of the external electrode is greater than the thickness of the external electrode in the first region. In this case, the term "thickness" of the external electrode can be understood to mean the extent of the partial region of the external electrode perpendicular to a side area of the stack on which the first region of the external electrode is arranged.

By way of example, by means of a "folding over" of the external electrode in the second region, for example by means of a crimping tool, the external electrode can be pres sure-deformed in the second region such that the width of the external electrode is smaller in the second region than in the first region and at the same time the thickness of the external electrode is greater in the second region than in the first region. "Folding over" can mean, for example, that the external electrode is folded in the second region in the center along a folding line running in the stacking direction.

A further contact-connection for supplying voltage can be fixed, for example by means of soldering or welding, in the second region projecting beyond the stack. It is thereby possible to avoid soldering and welding in the vicinity of the surface of the stack which might damage the piezoelectric multilayer component.

Furthermore, a method for forming an external electrode in a piezoelectric multilayer component is specified.

In this case, firstly a stack of piezoelectric layers and electrode layers arranged therebetween is provided. A base metallization can be applied on a side area of the stack, for example by a silver-palladium paste or a copper-containing paste being applied to the side area and then being fired.

Furthermore, a conductive element is provided, which has a first and second region. The first region of the element is arranged at the stack, for example on a side area on which a base metallization is applied, such that the second region projects beyond the stack. The first region of the element is fixed to the stack, preferably to the base metallization, for example by means of a solder material.

Afterward, the second region of the element is pressure-deformed. For this purpose, preferably a pressure tool comprising pressing tongues, for example a clamping tool, is arranged in the second region of the conductive element for example at two different sides of the element and then pressed together. In this way, an external electrode of the component is formed from the conductive element. As a result of the pressure-deforming, the external electrode formed at the component differs in its outer form from the initial form of the conductive element.

As a result of the pressure-deformation, by way of example, the thickness and width of the external electrode in the second region can be different from the thickness and the width in the first region. The geometry of the external electrode in the second region can be adapted arbitrarily to the requirements of the multilayer component in order, for example, to facilitate the fitting of a further contact-connection to the external electrode.

BRIEF DESCRIPTION OF THE DRAWINGS

The piezoelectric multilayer component specified and its advantageous configurations are explained below with reference to schematic figures, in which.

DETAILED DESCRIPTION OF ILLUSTRATIVE EMBODIMENTS

Figure 1:
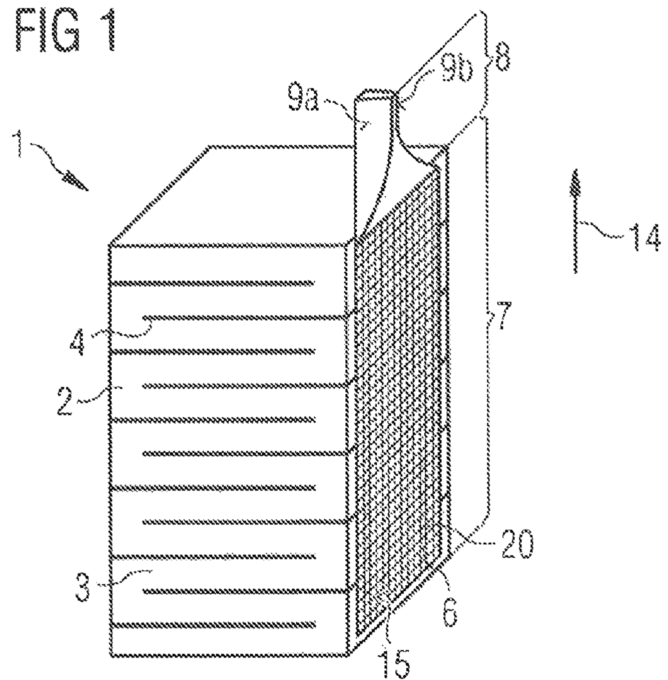
FIG. 1 shows a perspective view of a piezoelectric multilayer component comprising an external electrode.

FIG. 1 shows a piezoelectric multilayer component 1 comprising an external electrode 6, which is at least partly pressure-deformed in a second region 8.

The piezoelectric multilayer component 1 comprises a stack 2 of piezoelectric layers 3 and electrode layers 4 situated therebetween, which are arranged one above another along a stacking direction 14. The stacking direction 14 corresponds to the longitudinal axis of the stack 2. The piezoelectric layers 3 and the electrode layers 4 are jointly sintered and form a monolithic sintering body.

The electrode layers 4 extend as far as to an outer side of the stack 2 alternately along the stacking direction 14 and are spaced apart from the opposite outer side. In order to make contact with the electrode layers 4, an external electrode 6 is fixed on the outer side of the stack 2 in a first region 7 of the external electrode 6. The external electrode 6 is shaped in a planar fashion in the first region 7, i.e., the external electrode 6 is embodied such that it is flat and extends over a large two-dimensional region in the first region 7. Said two-dimensional region can also be designated as a main area 15 of the external electrode. The first region 7 covers a large part of a side area of the stack 2. The external electrode 6 bears with the main area 15 on the stack 2 and is connected to the stack 2 over the whole area.

In this exemplary embodiment, the external electrode 6 is embodied as a wire fabric. The wire fabric comprises wires 20 which are interwoven and which comprise for example materials such as steel, copper or iron-nickel alloys.

A second region 8 of the external electrode 6 projects beyond the stack 2 in the direction of the stacking direction 14. The external electrode 6 has, in the second region 8, partial areas 9*a* and 9*b* inclined relative to the main area 15. The two partial areas 9*a*, 9*b* bear against one another in the second region 8. Alternatively, the external electrode 6 can also have a different pressure-deformed geometry in the second region 8.

In the same or a similar manner, a further external electrode is fixed and pressure-deformed (not depicted here) on the opposite outer side.

Figure 2:
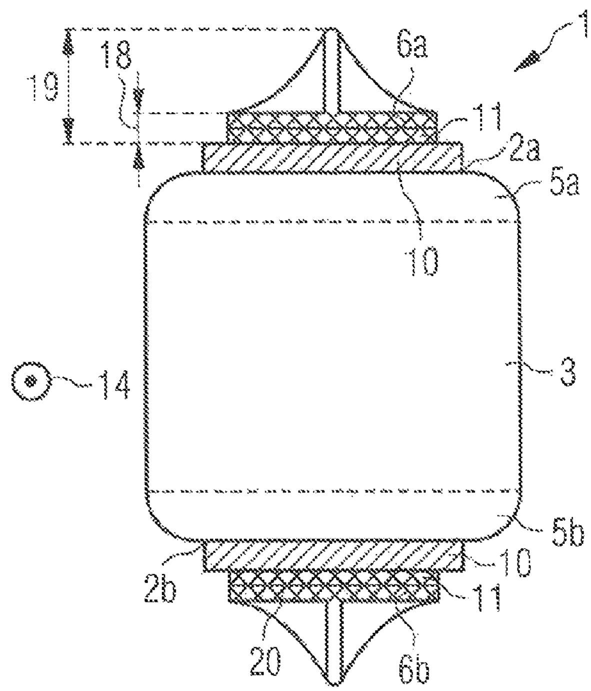
FIG. 2 shows a cross section of a piezoelectric multilayer component comprising an external electrode.

FIG. 2 shows a cross section of the piezoelectric multilayer component 1 in accordance with FIG. 1, in which a plan view of a piezoelectric layer 3 can be seen. The stack 2 of piezoelectric layers 3 and electrode layers 4 has two opposite inactive zones 5*a*, 5*b*. No overlap of adjacent electrode layers 4 of opposite polarities occurs within the inactive zones 5*a*, 5*b*, as seen in the stacking direction 14. A base metallization 10 is applied to two opposite outer sides 2*a*, 2*b* of the stack 2, said outer sides adjoining the inactive zones 5*a*, 5*b*. The base metallization 10 is preferably applied in the form of a silver-palladium paste or a copper-containing paste to a partial region of the outer side of the stack 2 and concomitantly fired during the sintering of the stack. The outer electrodes 6*a*, 6*b* are in each case fixed to the base metallization 10 by means of a solder layer 11.

As a result of the pressure-deformation of the external electrode 6 in the second region 8, for example by means of a crimping tool, the external electrode 6 differs in terms of its thickness 18 in the first region 7 from its thickness 19 in the second region 8 after the pressure-deformation. In particular, the external electrode 6 has a smaller thickness 18 in the first region 7 than in the second region 8. As a result of the pressure-deformation of the external electrode 6 in the second region 8, the geometry of the second region 8 of the external electrode 6 can be adapted to the specific geometrical requirements of a further contact-connection 12.

Figure 3:
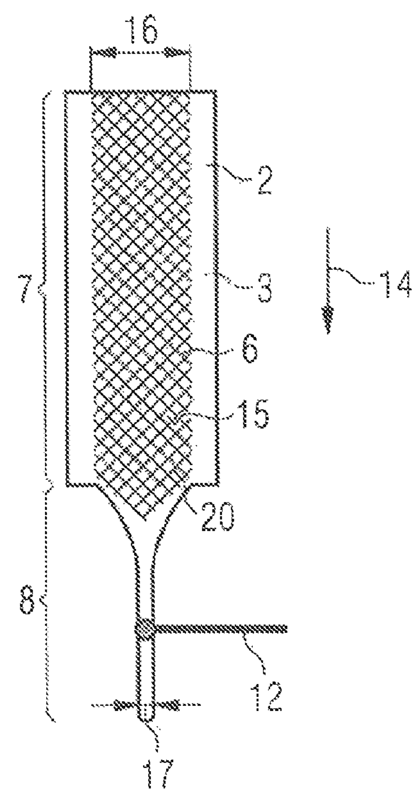
FIG. 3 shows a lateral plan view of a piezoelectric multilayer component comprising an external electrode.

FIG. 3 shows a lateral plan view of the piezoelectric multilayer component 1 in accordance with FIG. 1, wherein the component 1 is rotated by 180 degrees with respect to the stacking direction 14 in comparison with the component 1 in FIG. 1. The external electrode 6 is embodied in planar fashion in the first region 7 and has a main area 15, at which it is fixed to the stack 2 for example by means of a soft solder.

As a result of the pressure-deformation, the external electrode 6 differs in terms of its width 17 in the second region 8 from its width 16 in the first region 7. By virtue of a more slender form of the external electrode 6 in the second region 8, by way of example, the fitting of a further contact-connection 12 can be facilitated or the external electrode 6 can be adapted to its installation space.

Such a further contact-connection 12 serves for supplying voltage and is fixed to the external electrode 6 in the second region 8 for example by means of a soldering or a welding. As a result of the further contact-connection 12 being fixed in the second region 8 of the external electrode 6, it is possible for example it is possible for example to avoid or reduce soldering and welding processes at the surface of the stack 2 which may lead to damage to the stack 2.

Figure 4A:
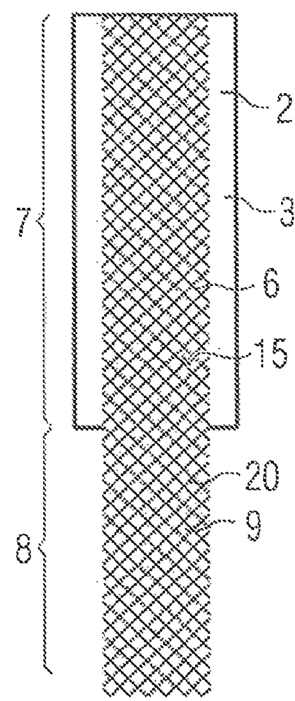
FIGS. 4A, 4B and 4C show method steps of a method for forming an external electrode in a piezoelectric multilayer component.
Figure 4B:
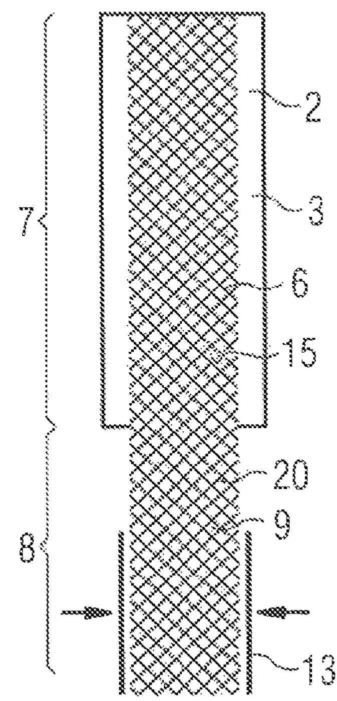
Figure 4C:
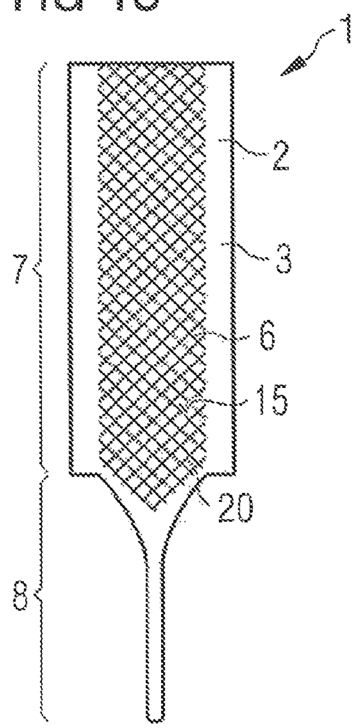

FIGS. 4A, 4B and 4C show method steps of a method for forming an external electrode in a piezoelectric multilayer component.

FIG. 4A shows a stack 2 of piezoelectric layers 3 and electrode layers (not shown here) arranged therebetween, at which stack a conductive element 9 having a first region 7 and a second region 8 is arranged and fixed.

The second region 8 constitutes an extension of the first region 7. The element 9 is shaped in planar fashion, i.e., it is embodied such that it is flat and extends over a large two-dimensional region. The region shaped in planar fashion in the first region 7 is designated as a main area 15 of the element 9.

The conductive element 9 is arranged at the stack 2 such that it bears on the stack 2 over the whole area with its main area 15 in the first region 7 and projects beyond the stack 2 in the stacking direction 14 in the second region 8. Afterward, the element 9 is fixed to the stack 2 by its main area 15 in the first region 7, for example by means of soldering.

FIG. 4B shows the stack 2 and the conductive element 9 after the element 9 has been fixed to the stack 2 and illustrates the pressure-deforming of a part of the second region 8 of the element 9 by means of a pressing tool 13. In this case, a pressing tool 13 comprising pressing tongues is arranged in the second region 8 at two different sides of the element 9 and then pressed together. By way of example, a crimping tool can be used as the pressing tool 13.

FIG. 4C shows the conductive element 9 after the pressure-deforming step. An external electrode 6 is formed by the conductive element 9 which is at least partly pres sure-deformed in the second region 8 and which is fixed to the stack 2.

The invention is not restricted to the exemplary embodiments by the description on the basis of said exemplary embodiments, but rather encompasses any novel feature and also any combination of features. This includes, in particular, any combination of features in the patent claims, even if this feature or this combination itself is not explicitly specified in the patent claims or exemplary embodiments.

The invention claimed is:

1. A piezoelectric multilayer component comprising:

a stack of piezoelectric layers and electrode layers arranged therebetween; and an external electrode having a first region, that is fixed to the stack, and a second region that projects beyond the stack, wherein the external electrode is at least partly pressure-deformed in the second region, and wherein at least two partial areas of the external electrode bear against one another in the second region.

2. The multilayer component according to claim 1, wherein the first and second regions are formed from a common element.

3. The multilayer component according to claim 1, wherein the external electrode is embodied such that it is at least partly flat and has a main area.

4. The multilayer component according to claim 3, wherein the external electrode is arranged with its main area at the stack in the first region.

5. The multilayer component according to claim 3, wherein, in the second region, at least one partial area of the external electrode is inclined relative to the main area of the external electrode.

6. The multilayer component according to claim 1, wherein the external electrode is at least partly folded in the second region.

7. The multilayer component according to claim 1, wherein the external electrode is embodied as a net, and wherein the net has wires which are interwoven.

8. The multilayer component according to claim 7, wherein at least one of the wires extends from the first region into the second region.

9. The multilayer component according to claim 7, wherein, in the second region, at least one of the wires has first and second wire sections, and wherein the wire has a different thickness in the first wire section than in the second wire section.

10. The multilayer component according to claim 1, wherein the external electrode has, in the second region, at least one partial region in which a width of the external electrode is less than a width of the external electrode in the first region.

11. The multilayer component according to claim 1, wherein the external electrode has, in the second region, at least one partial region in which a thickness of the external electrode is greater than a thickness of the external electrode in the first region.

12. The multilayer component according to claim 1, wherein the multilayer component has at least one further contact-connection fixed in the second region of the external electrode.

13. A method for forming an external electrode in a piezoelectric multilayer component, the method comprising:

providing a stack of piezoelectric layers and electrode layers arranged therebetween;

providing a conductive element having a first region and a second region;

arranging the first region of the conductive element at the stack, such that the second region projects beyond the stack;

fixing the first region of the element to the stack; and pressure-deforming the second region of the element such that at least two partial areas of the second region bear against one another.

14. The method according to claim 13, wherein the pressure-deforming comprises using a crimping tool.

* * * * *